United States Patent
Lee et al.

(10) Patent No.: US 6,860,533 B2
(45) Date of Patent: Mar. 1, 2005

(54) SUBSTRATE LOADING/UNLOADING APPARATUS FOR MANUFACTURING A LIQUID CRYSTAL DISPLAY DEVICE

(75) Inventors: Sang Seok Lee, Taegu-kwangyokshi (KR); Sang Ho Park, Pusan-kwangyokshi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 80 days.

(21) Appl. No.: 10/259,340

(22) Filed: Sep. 30, 2002

(65) Prior Publication Data

US 2003/0175097 A1 Sep. 18, 2003

(30) Foreign Application Priority Data

Mar. 8, 2002 (KR) ........................................ 2002-12388

(51) Int. Cl.[7] ................................................ B25J 15/06
(52) U.S. Cl. ...................... 294/64.1; 294/902; 414/941
(58) Field of Search ............................... 294/1.1, 64.1, 294/64.2, 64.3, 902, 86.4; 414/935–941, 752.1; 901/40

(56) References Cited

U.S. PATENT DOCUMENTS

| | | |
|---|---|---|
| 3,978,580 A | 9/1976 | Leupp et al. |
| 4,094,058 A | 6/1978 | Yasutake et al. |
| 4,653,864 A | 3/1987 | Baron et al. |
| 4,691,995 A | 9/1987 | Yamazaki et al. |
| 4,775,225 A | 10/1988 | Tsuboyama et al. |
| 5,247,377 A | 9/1993 | Omeis et al. ................. 359/76 |
| 5,263,888 A | 11/1993 | Ishihara et al. |
| 5,379,139 A | 1/1995 | Sato et al. |
| 5,406,989 A | 4/1995 | Abe |
| 5,499,128 A | 3/1996 | Hasegawa et al. |
| 5,507,323 A | 4/1996 | Abe |
| 5,511,591 A | 4/1996 | Abe ............................. 141/7 |

(List continued on next page.)

FOREIGN PATENT DOCUMENTS

| | | |
|---|---|---|
| EP | 1003066 | 5/2000 |
| JP | 51-65656 | 6/1976 |
| JP | 52-149725 | 12/1977 |
| JP | 57-38414 | 3/1982 |
| JP | 57-88428 | 6/1982 |
| JP | 58-27126 | 2/1983 |
| JP | 59-57221 | 4/1984 |
| JP | 59-195222 | 11/1984 |
| JP | 60-111221 | 6/1985 |
| JP | 60-164723 | 8/1985 |
| JP | 60-217343 | 10/1985 |
| JP | 61-7822 | 1/1986 |
| JP | 61-55625 | 3/1986 |

(List continued on next page.)

Primary Examiner—Dean J. Kramer
(74) Attorney, Agent, or Firm—Morgan, Lewis & Bockius LLP (57) ABSTRACT

A substrate loading/unloading apparatus include a body part, an arm part connected to the body part for loading/unloading a substrate, a finger connector connected to the arm part, and a plurality of finger parts connected to the finger connector, wherein each of the finger parts include a plurality of protrusions to contact a bottom surface of the substrate.

19 Claims, 7 Drawing Sheets

U.S. PATENT DOCUMENTS

| | | | |
|---|---|---|---|
| 5,539,545 A | 7/1996 | Shimizu et al. | |
| 5,548,429 A | 8/1996 | Tsujita | |
| 5,642,214 A | 6/1997 | Ishii et al. | 349/96 |
| 5,680,189 A | 10/1997 | Shimizu et al. | |
| 5,692,873 A * | 12/1997 | Weeks et al. | 414/627 |
| 5,742,370 A | 4/1998 | Kim et al. | 349/124 |
| 5,757,451 A | 5/1998 | Miyazaki et al. | |
| 5,765,889 A * | 6/1998 | Nam et al. | 294/64.1 |
| 5,852,484 A | 12/1998 | Inoue et al. | |
| 5,854,664 A | 12/1998 | Inoue et al. | |
| 5,861,932 A | 1/1999 | Inata et al. | |
| 5,875,922 A | 3/1999 | Chastine et al. | |
| 5,952,676 A | 9/1999 | Sato et al. | |
| 5,956,112 A | 9/1999 | Fujimori et al. | |
| 6,001,203 A | 12/1999 | Yamada et al. | |
| 6,011,609 A | 1/2000 | Kato et al. | 349/190 |
| 6,016,178 A | 1/2000 | Kataoka et al. | 349/117 |
| 6,016,181 A | 1/2000 | Shimada | |
| 6,055,035 A | 4/2000 | Von Gutfeld et al. | 349/187 |
| 6,062,241 A * | 5/2000 | Tateyama et al. | 134/137 |
| 6,068,316 A * | 5/2000 | Kim et al. | 294/64.1 |
| 6,072,157 A * | 6/2000 | Klebanoff et al. | 219/228 |
| 6,152,677 A * | 11/2000 | Tateyama et al. | 414/738 |
| 6,163,357 A | 12/2000 | Nakamura | 349/155 |
| 6,219,126 B1 | 4/2001 | Von Gutfeld | |
| 6,226,067 B1 | 5/2001 | Nishiguchi et al. | 349/155 |
| 6,236,445 B1 | 5/2001 | Foschaar et al. | |
| 6,304,306 B1 | 10/2001 | Shiomi et al. | 349/88 |
| 6,304,311 B1 | 10/2001 | Egami et al. | |
| 6,322,116 B1 * | 11/2001 | Stevens | 294/64.3 |
| 6,337,730 B1 | 1/2002 | Ozaki et al. | |
| 6,414,733 B1 | 7/2002 | Ishikawa et al. | 349/110 |
| 6,634,686 B2 * | 10/2003 | Hosokawa | 294/1.1 |
| 2001/0021000 A1 | 9/2001 | Egami et al. | |

FOREIGN PATENT DOCUMENTS

| | | |
|---|---|---|
| JP | 62-89025 | 4/1987 |
| JP | 62-90622 | 4/1987 |
| JP | 62-205319 | 9/1987 |
| JP | 63-109413 | 5/1988 |
| JP | 63-110425 | 5/1988 |
| JP | 63-128315 | 5/1988 |
| JP | 63-311233 | 12/1988 |
| JP | 5-127179 | 5/1993 |
| JP | 5-154923 | 6/1993 |
| JP | 5-265011 | 10/1993 |
| JP | 5-281557 | 10/1993 |
| JP | 5-281562 | 10/1993 |
| JP | 6-51256 | 2/1994 |
| JP | 6-148657 | 5/1994 |
| JP | 6-160871 | 6/1994 |
| JP | 6-235925 | 8/1994 |
| JP | 6-313870 | 8/1994 |
| JP | 6-265915 | 9/1994 |
| JP | 7-84268 | 3/1995 |
| JP | 7-128674 | 5/1995 |
| JP | 7-181507 | 7/1995 |
| JP | 8-95066 | 4/1996 |
| JP | 8-101395 | 4/1996 |
| JP | 8-106101 | 4/1996 |
| JP | 8-171094 | 7/1996 |
| JP | 8-190099 | 7/1996 |
| JP | 8-240807 | 9/1996 |
| JP | 9-5762 | 1/1997 |
| JP | 9-26578 | 1/1997 |
| JP | 9-61829 | 3/1997 |
| JP | 9-73075 | 3/1997 |
| JP | 9-73096 | 3/1997 |
| JP | 9-127528 | 5/1997 |
| JP | 9-230357 | 9/1997 |
| JP | 9-281511 | 10/1997 |
| JP | 9-311340 | 12/1997 |
| JP | 10-123537 | 5/1998 |
| JP | 10-123538 | 5/1998 |
| JP | 10-142616 | 5/1998 |
| JP | 10-177178 | 6/1998 |
| JP | 10-221700 | 8/1998 |
| JP | 10-282512 | 10/1998 |
| JP | 10-333157 | 12/1998 |
| JP | 10-333159 | 12/1998 |
| JP | 11-133438 | 12/1998 |
| JP | 11-14953 | 1/1999 |
| JP | 11-38424 | 2/1999 |
| JP | 11-64811 | 3/1999 |
| JP | 11-109388 | 4/1999 |
| JP | 11-142864 | 5/1999 |
| JP | 11-174477 | 7/1999 |
| JP | 11-212045 | 8/1999 |
| JP | 11-248930 | 9/1999 |
| JP | 11-326922 | 11/1999 |
| JP | 11-344714 | 12/1999 |
| JP | 2000-2879 | 1/2000 |
| JP | 2000-29035 | 1/2000 |
| JP | 2000-56311 | 2/2000 |
| JP | 2000-66165 | 3/2000 |
| JP | 2000-137235 | 5/2000 |
| JP | 2000-147528 | 5/2000 |
| JP | 2000-193988 | 7/2000 |
| JP | 2000-241824 | 8/2000 |
| JP | 2000-284295 | 10/2000 |
| JP | 2000-292799 | 10/2000 |
| JP | 2000-310759 | 11/2000 |
| JP | 2000-310784 | 11/2000 |
| JP | 2000-338501 | 12/2000 |
| JP | 2001-5401 | 1/2001 |
| JP | 2001-5405 | 1/2001 |
| JP | 2001-13506 | 1/2001 |
| JP | 2001-33793 | 2/2001 |
| JP | 2001-42341 | 2/2001 |
| JP | 2001-51284 | 2/2001 |
| JP | 2001-66615 | 3/2001 |
| JP | 2001-91727 | 4/2001 |
| JP | 2001-117105 | 4/2001 |
| JP | 2001-117109 | 4/2001 |
| JP | 2001-133745 | 5/2001 |
| JP | 2001-133794 | 5/2001 |
| JP | 2001-133799 | 5/2001 |
| JP | 2001-142074 | 5/2001 |
| JP | 2001-147437 | 5/2001 |
| JP | 2001-154211 | 6/2001 |
| JP | 2001-166272 | 6/2001 |
| JP | 2001-166310 | 6/2001 |
| JP | 2001-183683 | 7/2001 |
| JP | 2001-201750 | 7/2001 |
| JP | 2001-209052 | 8/2001 |
| JP | 2001-209060 | 8/2001 |
| JP | 2001-215459 | 8/2001 |
| JP | 2001-222017 | 8/2001 |
| JP | 2001-235758 | 8/2001 |
| JP | 2001-255542 | 9/2001 |
| JP | 2001-264782 | 9/2001 |
| JP | 2001-272640 | 10/2001 |
| JP | 2001-281675 | 10/2001 |
| JP | 2001-281678 | 10/2001 |
| JP | 2001-282126 | 10/2001 |
| JP | 2001-305563 | 10/2001 |
| JP | 2001-330837 | 11/2001 |
| JP | 2001-330840 | 11/2001 |
| JP | 2001-356353 | 12/2001 |
| JP | 2001-356354 | 12/2001 |

| | | | | | |
|---|---|---|---|---|---|
| JP | 2002-14360 | 1/2002 | JP | 2002-122873 | 4/2002 |
| JP | 2002-23176 | 1/2002 | JP | 2002-139734 | 5/2002 |
| JP | 2002-49045 | 2/2002 | JP | 2002-202512 | 7/2002 |
| JP | 2002-82340 | 3/2002 | JP | 2002-202514 | 7/2002 |
| JP | 2002-90759 | 3/2002 | JP | 2002-214626 | 7/2002 |
| JP | 2002-90760 | 3/2002 | KR | 2000-35302 | 6/2000 |
| JP | 2002-107740 | 4/2002 | | | |
| JP | 2002-122872 | 4/2002 | | | |

* cited by examiner

SUBSTRATE LOADING/UNLOADING APPARATUS FOR MANUFACTURING A LIQUID CRYSTAL DISPLAY DEVICE

The present invention claims the benefit of Korean Patent Application No. P2002-012388 filed in Korea on Mar. 8, 2002 which is hereby incorporated by reference.

BACKGROUND OF THE INVENTION

1. Field of the Invention

The present invention relates to an apparatus for manufacturing a liquid crystal display, and more particularly, to a substrate loading/unloading apparatus used in manufacturing a liquid crystal display.

2. Discussion of the Related Art

In response to an increased demand for various types of display devices, flat panel type displays such as liquid crystal display (LCD), plasma display panel (PDP), electroluminescent display (ELD), and vacuum fluorescent display (VFD) have been developed. In particular, LCD devices are commonly used because of their high resolution, light weight, thin profile, and low power consumption. In addition, LCD devices are commonly implemented for mobile devices, such as monitors for notebook computers, and for monitors of computers and televisions.

LCD devices are provided with an LCD panel for displaying image data, and a driving unit for applying a driving signal to the LCD panel. The LCD panel is provided with first and second glass substrates bonded at a certain distance with liquid crystal material injected therebetween. A plurality of gate lines are formed along a first direction at fixed intervals on the first glass substrate (i.e., TFT array substrate), and a plurality of data lines are formed along a second direction perpendicular to the first direction, thereby defining a plurality of pixel regions. A plurality of pixel electrodes are formed in a matrix arrangement at the pixel regions, and a plurality of thin film transistors (TFT) are formed at the pixel regions. Accordingly, the plurality of thin film transistors are enabled by signals transmitted along the gate lines and transfer signals transmitted along the data lines to each pixel electrode.

In order to prevent light leakage, black matrix films are formed on the second glass substrate (i.e., color filter substrate) except at regions of the second glass substrate corresponding to the pixel regions of the first glass substrate. Also, a red, green, and blue color filter substrate is formed on the second glass substrate to produce colored light, and a common electrode is formed on the color filter substrate to produce images.

Processes for manufacturing an LCD device include injection and drop methods. The injection method according to the prior art includes steps of forming a sealant pattern on one of the first and second substrates to form an injection inlet, bonding the first and second substrates to each other within a vacuum processing chamber, and injecting liquid crystal material through the injection inlet. The drop method according to the prior art, which is disclosed in Japanese Patent Application Nos. 11-089612 and 11-172903, includes steps of dropping liquid crystal material on a first substrate, arranging a second substrate over the first substrate, and moving the first and second substrates to be adjacent to each other, thereby bonding the first and second substrates to each other.

Figure 1A:
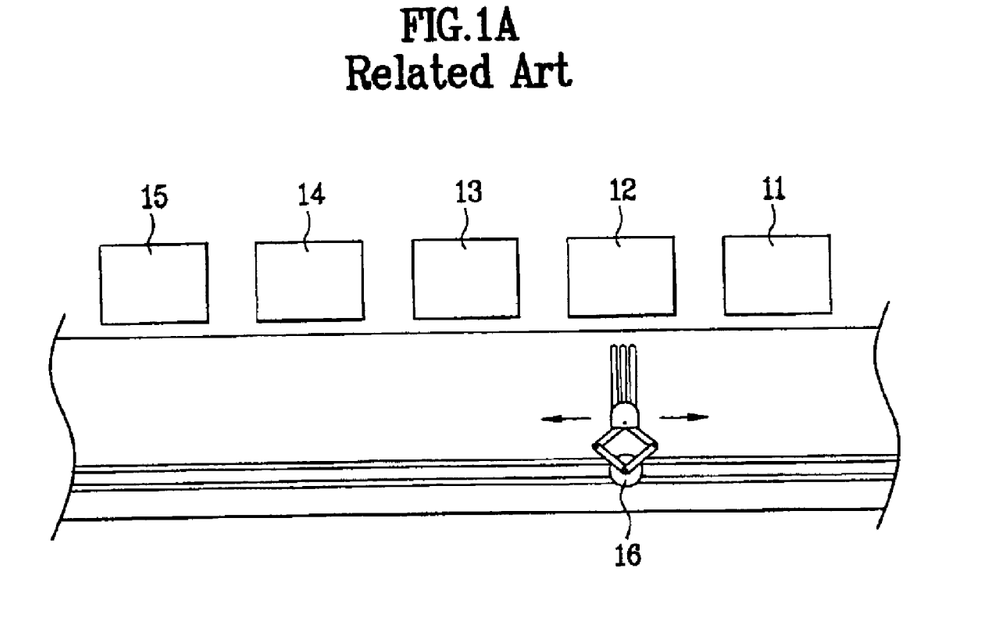
FIG. 1A is a plane view of a manufacturing apparatus of a liquid crystal display device according to the related art.

FIG. 1A is a plane view of a manufacturing apparatus of a liquid crystal display device according to the related art. In FIG. 1A, the manufacturing apparatus uses the liquid crystal injecting method and includes a bonding unit 11 for bonding first and second glass substrates together, a hardening unit 12 for hardening the bonded substrates, an injecting unit 13 for injecting a liquid crystal material through an injecting hole into the space formed between the bonded substrates, a sealing unit 14 for sealing the injecting hole, a cleaning unit 15 for cleaning the liquid crystal material-injected panel, and a substrate loading/unloading unit 16 for selectively loading/unloading the bonded substrates from one unit to another.

The liquid crystal injecting method includes steps of depositing and drying a sealant on the first substrate by a sealant dispensing unit and a sealant drying unit that are arranged along a first processing line. Simultaneously, the second glass substrate passes through a second processing line having a silver dotting unit for depositing dots of silver on the second glass substrate, and a spacer dispersion unit for dispersing spacers on the second glass substrate.

Next, the first and second glass substrates are transferred to the bonding unit 11 by the substrate loading/unloading unit 16, and bonded together by the bonding unit 11. Then, the bonded substrates are transferred to the hardening unit 12 by the substrate loading/unloading unit 16. The bonded substrates are separated by a certain distance by the spacer, thereby forming a cavity spaced, and an injecting hole is formed at a certain region along a circumference of the bonded substrates.

Then, the bonded substrates are hardened at the hardening unit 12, and are transferred to the liquid crystal material injecting unit by the substrate loading/unloading unit 16. Subsequently, a liquid crystal material is injected by the injecting unit 13 through the injecting hole into the cavity space formed between the bonded substrates, and the injecting hole is sealed by the sealing unit 14. Then, the bonded substrates are cleaned by the cleaning unit 15, thereby completing the process of manufacturing the LCD device.

Figure 1B:
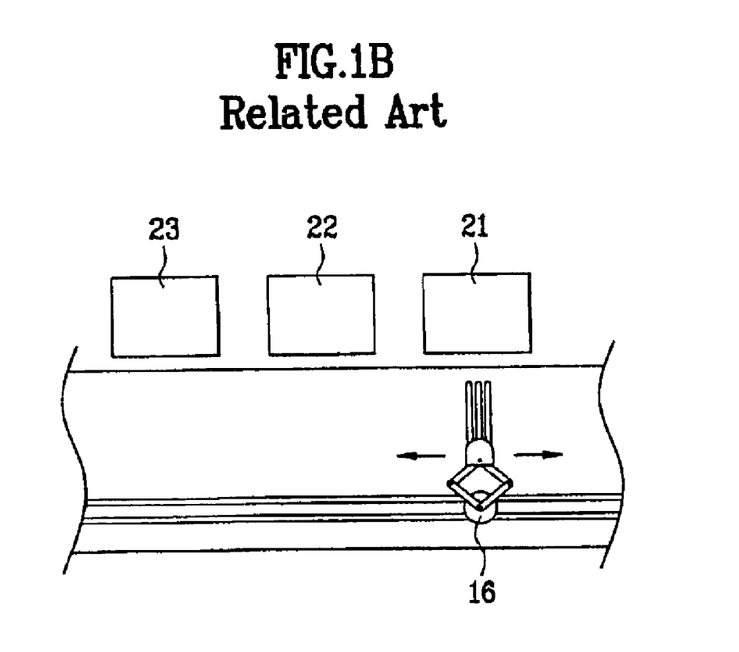
FIG. 1B is a plane view of a manufacturing apparatus of a liquid crystal display device according to the related art.

FIG. 1B is a plane view of a manufacturing apparatus of a liquid crystal display device according to the related art. In FIG. 1B, the manufacturing apparatus uses the liquid crystal dropping method and includes a bonding unit 21 for bonding a first glass substrate, which has sealant and liquid crystal material deposited thereon, and a second glass substrate together, a hardening unit 22 for hardening the bonded substrates, a cutting unit 23 for cutting the hardened bonded substrates in a unit of an LCD device, and a substrate loading/unloading unit 16 for selectively loading/unloading the bonded substrates from one unit to another.

The liquid crystal dropping method includes steps of depositing liquid crystal material and sealant on either of a first or second substrate, and loading both the first and second substrates into a bonding unit 21 using a substrate loading/unloading unit 16. After bonding the first and second substrates, the bonded substrates are unloaded from the bonding unit 21 by the substrate loading/unloading unit 16. The bonded substrates unloaded from the bonding unit 21 are now transferred to the hardening unit 22 to perform a hardening process thereon.

and The bonded substrates may undergo a hardening process, which may include a thermal-hardening process using application of heat, in the hardening unit 22 for a certain time, and are then unloaded from the hardening unit 22 by the substrate loading/unloading unit 16. Subsequently, the bonded substrates unloaded from the hardening unit 22 are transferred into the cutting unit 23, and undergo a cutting process to produce individual display units, thereby completing the manufacturing of the liquid crystal panel.

Figure 2:
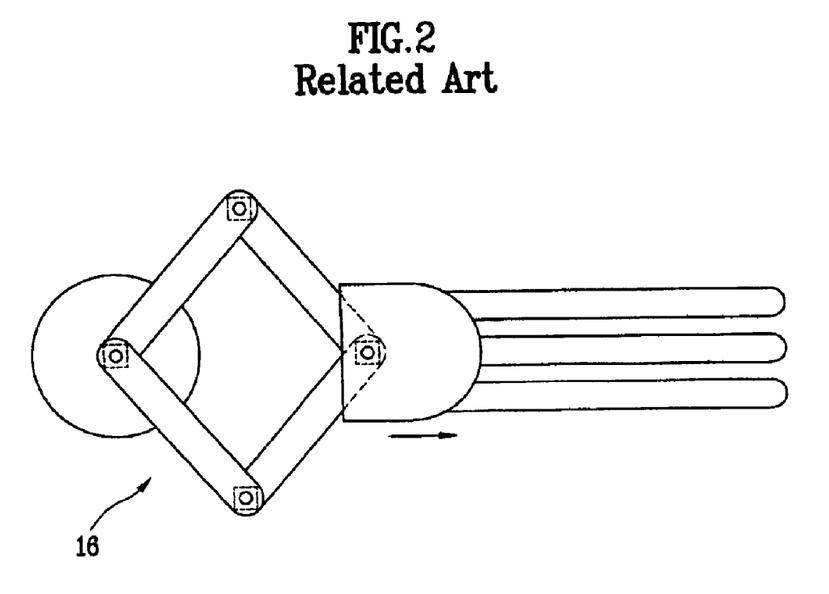
FIG. 2 is a plane view of a substrate loading/unloading unit for manufacturing a liquid crystal display device according to the related art.

FIG. 2 is a plane view of a substrate loading/unloading unit for manufacturing a liquid crystal display device according to the related art. The manufacturing apparatus using the liquid crystal injecting method and the liquid crystal dropping method according to the prior art requires repeated loading/unloading an individual substrate or bonded substrates using the substrate loading/unloading unit 16. However, the related art substrate loading/unloading unit 16 does not reliably perform the loading/unloading operation.

First, contact regions between the substrates and the loading/unloading unit 16 have the same shape and configuration. Thus, one substrate loading/unloading unit cannot be easily reconfigured to accommodate substrates having different geometries or sizes.

Second, a temperature difference between the different contact regions of the substrates and a portion of the substrate loading/unloading unit causes a thermal gradient during transfer of the hardened and bonded substrates unloaded from the hardening unit because the temperatures of the bonded substrates heated during the hardening process and the substrate loading/unloading unit for loading/unloading the heated substrates in the hardening unit are different. Accordingly, the portions of the bonded substrates that contact the substrate loading/unloading unit are distorted due to the temperature difference.

For example, the temperature of the finger part of the substrate loading/unloading unit is about room temperature and the temperature of the hardening-completed substrates is about 100~150° C. (nominally 120° C.). Accordingly, a significant amount of heat transfer occurs at each contact region where the hardening-completed substrates contact the finger part of the substrate loading/unloading unit. Thus, each of the contact regions significantly distort the hardening-completed substrates.

SUMMARY OF THE INVENTION

Accordingly, the present invention is directed to a substrate loading/unloading apparatus for manufacturing a liquid crystal display device that substantially obviates one or more problems due to limitations and disadvantages of the related art.

An object of the present invention is to provide a substrate loading/unloading apparatus having an improved structure for loading/unloading each substrate.

Another object of the present invention is to provide a substrate loading/unloading apparatus that prevents distortion of the substrates caused by a temperature difference with bonded substrates during unloading of the bonded substrates from a hardening process.

Additional features and advantages of the invention will be set forth in part in the description which follows, and in part will become apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a substrate loading/unloading apparatus includes a body part, an arm part connected to the body part for loading/unloading a substrate, a finger connector connected to the arm part, and a plurality of finger parts connected to the finger connector, wherein each of the finger parts include a plurality of protrusions to contact a bottom surface of the substrate.

In another aspect, a substrate loading/unloading apparatus includes a body part, an arm part connected to the body part for loading/unloading a substrate, a finger connector connected to the arm part, and a plurality of finger parts connected to the finger connector, wherein each of the finger parts include at least one of a plurality of protrusions and absorption parts for affixing the substrate by a transferred absorptive force.

In another aspect, a substrate loading/unloading apparatus includes a body part, an arm part connected to the body part for loading/unloading a substrate, a finger connector connected to the arm part, and a plurality of finger parts connected to the finger connector, wherein a first one of the finger parts includes a plurality of protrusions, and second and third ones of the finger parts include an absorption part for affixing the substrate to the finger parts by an absorptive force.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
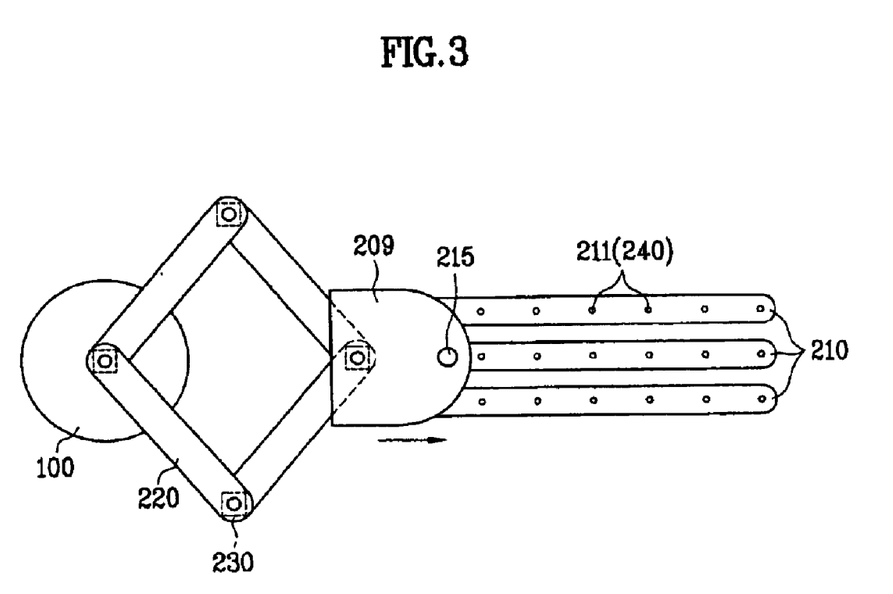
FIG. 3 is a plane view of an exemplary substrate loading/unloading unit for manufacturing a liquid crystal display device according to the present invention.

FIG. 3 is a plane view of an exemplary substrate loading/unloading unit for manufacturing a liquid crystal display device according to the present invention. In FIG. 3, the substrate loading/unloading unit may include a body part 100, a moving part (not shown), a plurality of arm parts 220, a plurality of stepper motors 230, a finger connector 209, a hydraulic/pneumatic cylinder 215, and a plurality of finger parts 210 each having a plurality of holes 211 and/or protrusions 240. The moving part moves the substrate loading/unloading unit to different locations along a production arrangement in which various apparatus for manufacturing an LCD device are placed, and may include rails and step motors.

The plurality of arm parts 220 are interconnected between the body part 100 and the finger connector 209, and may perform loading/unloading of the finger parts 210 into/out from each apparatus, and may be interconnected by the plurality of step motors 230 for generating a moving force to each of the arm parts 220 connected to the body part 100. Alternatively, a single step motor 230 may be used to generate the moving force and may be positioned on one of the arm parts 220 or on the finger connector 209. The finger parts 210 may include the plurality of holes 211 and protrusions 240 positioned along a length direction of the finger part 210. In addition, the plurality of holes 211 and protrusions 240 may be positioned in a staggered interval or an offset interval along the length direction of the finger part 210. An overall height of the protrusion 240 may be less than about 20 mm from a surface of the finger part 210, and may preferably be within a range of about 5–10 mm from the surface of the finger part 210.

Figure 4:
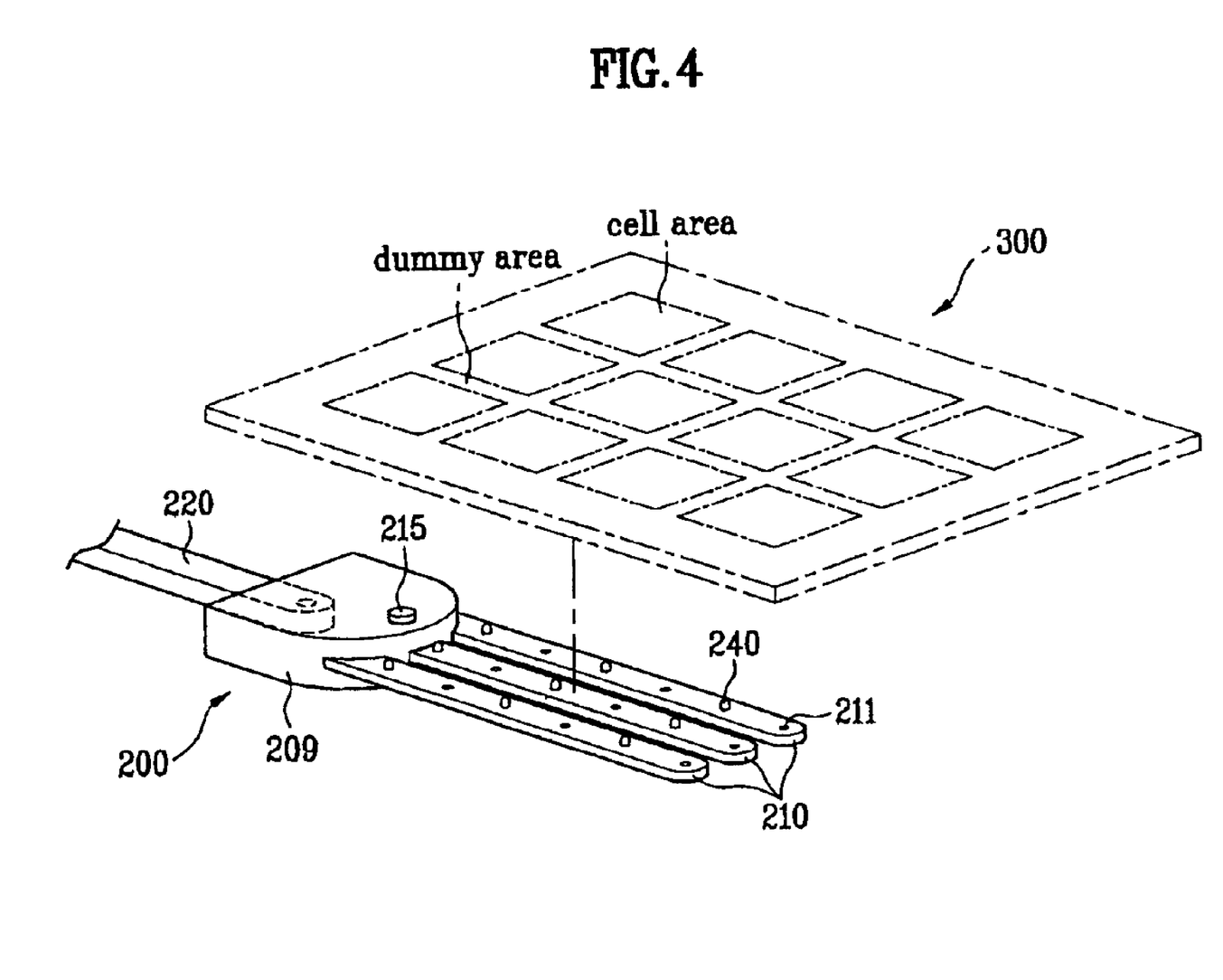
FIG. 4 is a perspective view of another exemplary substrate loading/unloading unit according to the present invention.

FIG. 4 is a perspective view of another exemplary substrate loading/unloading unit according to the present invention. In FIG. 4, substrate loading/unloading unit 200 may include an arm part 220, a finger connector 209, a plurality of finger parts 210, and a hydraulic/pneumatic cylinder 215. Each of the finger parts 210 may include a plurality of holes 211 and a plurality of protrusions 240 that correspond to dummy areas of a substrate 300. Each of the dummy areas separate cell areas of the substrate 300. The plurality of protrusions 240 may selectively protrude/retract from a surface of the finger parts 210 by application of force.

Figure 5:
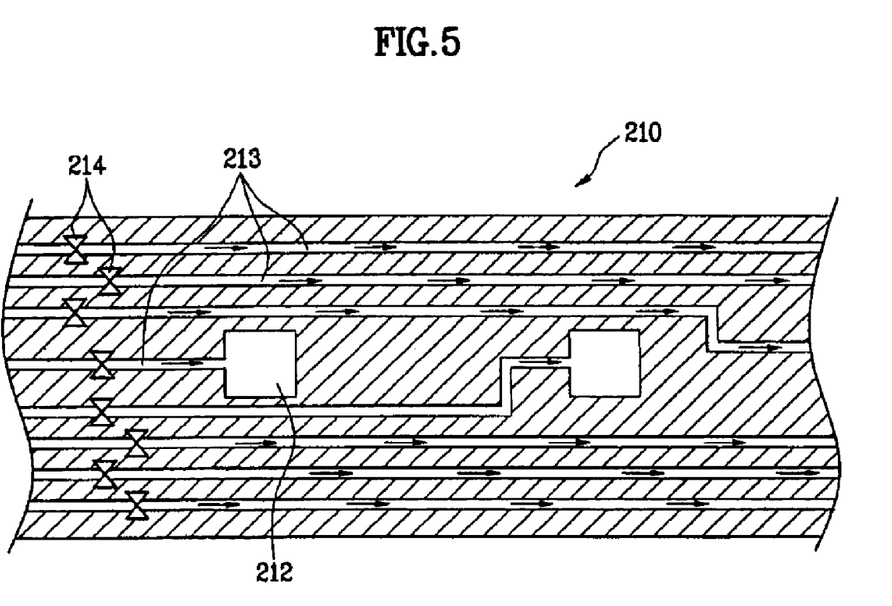
FIG. 5 is a cross sectional view of another exemplary substrate loading/unloading unit according to the present invention.

FIG. 5 is a cross sectional view of another exemplary substrate loading/unloading unit according to the present invention. In FIG. 5, a finger part 210 may include a plurality of spaces 212 each formed corresponding to each protrusion hole 211 (in FIG. 4). Each of the spaces 212 communicate with a plurality of passages 213 that extend along a lengthwise direction of the finger part 210. Each of the passages 213 may supply a compressive force to each of the spaces 212 by a valve system 214. The compressive force may be supplied by a hydraulic or pneumatic pressure cylinder 215 (in FIG. 4). The hydraulic or pneumatic cylinder 215 (in FIG. 4) may be positioned in one of the body part 100 (in FIG. 3), the moving part (not shown), any of the arm parts 220 (in FIG. 3), or any other part of the substrate loading/unloading unit without restricting movement.

Figure 6:
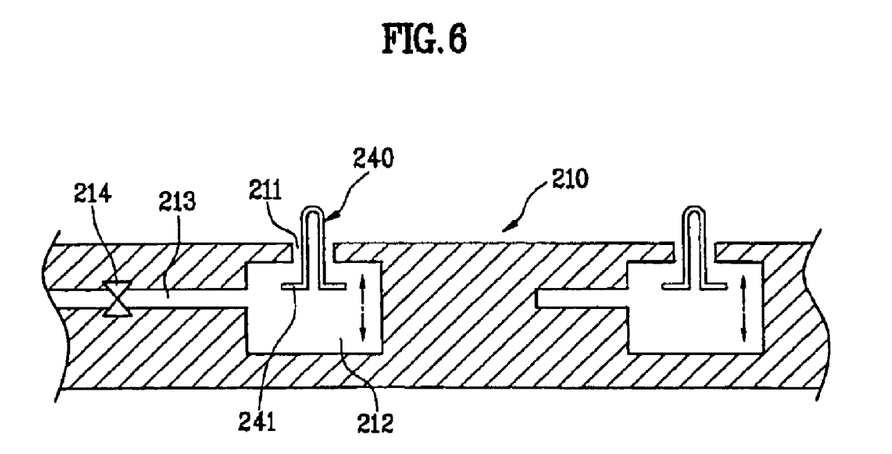
FIG. 6 is a cross sectional view of another exemplary substrate loading/unloading unit according to the present invention.

FIG. 6 is a cross sectional view of another exemplary substrate loading/unloading unit according to the present invention. In FIG. 6, a finger part 210 may include a plurality spaces 212 each connected to at least one of a plurality of passages 213. A protrusion 240 is positioned within each of the spaces 212 and an uppermost portion of the protrusion extends through a hole 211 and a stopper portion 241 remains within the hole 211. Accordingly, when a hydraulic or pneumatic source is supplied to the spaces 212 via a valve system 214, the protrusion 240 travels along a vertical direction through the hole 211 until the stopper portion 241 engages an uppermost surface of the space 212, thereby extending above an uppermost surface of the finger part 210. Conversely, when the hydraulic or pneumatic source is removed from the spaces 212 via the valve system 214, the protrusion 240 travels along a vertical direction through the hole 211 to retract below the uppermost surface of the finger part 210 so that the stopper portion 241 is positioned on a lowermost surface of the space 212. An overall size and shape of the spaces 212 of the finger part 210 may be formed according to an overall size of each substrate to be loaded/unloaded.

Figure 7:
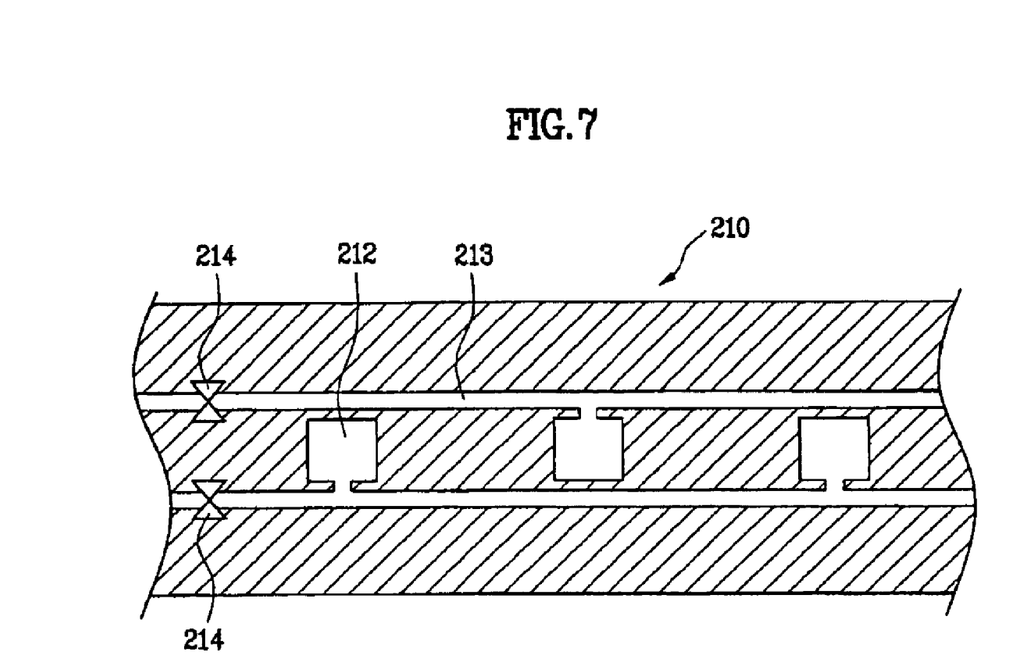
FIG. 7 is a cross sectional view of another exemplary substrate loading/unloading unit according to the present invention.

FIG. 7 is a cross sectional view of another exemplary substrate loading/unloading unit according to the present invention. In FIG. 7, a plurality of holes 212 may be positioned along a lengthwise direction of a finger part 210. Each of the holes 212 may be connected to at least one of a passage 213 to provide a hydraulic or pneumatic force. Moreover, each of the holes 212 may be grouped together such that multiple numbers of holes 212 may be connected to a common one of the passages 213, thereby accommodating substrates for differing sizes and configurations. For example, in a case of a substrate 300 having a size of 1000 mm×1200 mm all spaces 212 of the finger part 210 corresponding with dummy regions on the substrate 300 are commonly connected by one common passage 213. Thus, application of the hydraulic or pneumatic force through the passages 213 to the spaces via the valve system 214 only extend selected ones of the protrusions corresponding to the dummy regions to simultaneously extend above a surface of the finger part 210. Moreover, the valve system 214 corresponding to the spaces may be controlled to allow only certain ones of the protrusions from extending above the surface of the finger part 210. Accordingly, different sized substrates and substrates having different configurations of dummy and cell areas may be loaded/unloaded without having to reconfigure or change the finger part 210.

Figure 8:
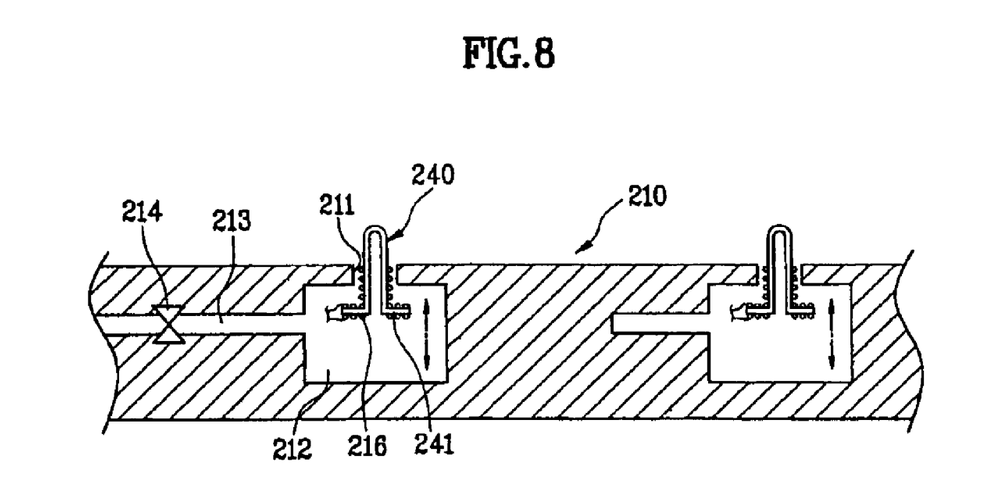
FIG. 8 is a cross sectional view another exemplary substrate loading/unloading unit according to the present invention.

FIG. 8 is a cross sectional view another exemplary substrate loading/unloading unit according to the present invention. In FIG. 8, each of a plurality of protrusions 240 may include a heating system 216. The heating system 216 may include a coil heater or a strip heater to raise a temperature of the protrusion 240, thereby preventing the flow of heat from a pair of bonded substrates having an elevated temperature to the protrusion 240. This prevents any distortion of the bonded substrates are locations where the protrusions 240 contact the bonded substrates. Moreover, the heating system 216 may include a coil heater or strip heater to provide heat to an entire length, or portion of the finger part 210. The heating system 216 may be placed within the finger part 210 such that each protrusion 240 is maintained at a constant temperature.

Alternatively, heat may be supplied to the protrusions 240 by a heating system for heating the hydraulic or pneumatic source that supplies the force to the spaces 212. Accordingly, each protrusion 240 may be heated during a period of time when the valve system 214 is enabled and a flow of hydraulic fluid or pneumatic air is provided to the spaces 212.

Figure 9:
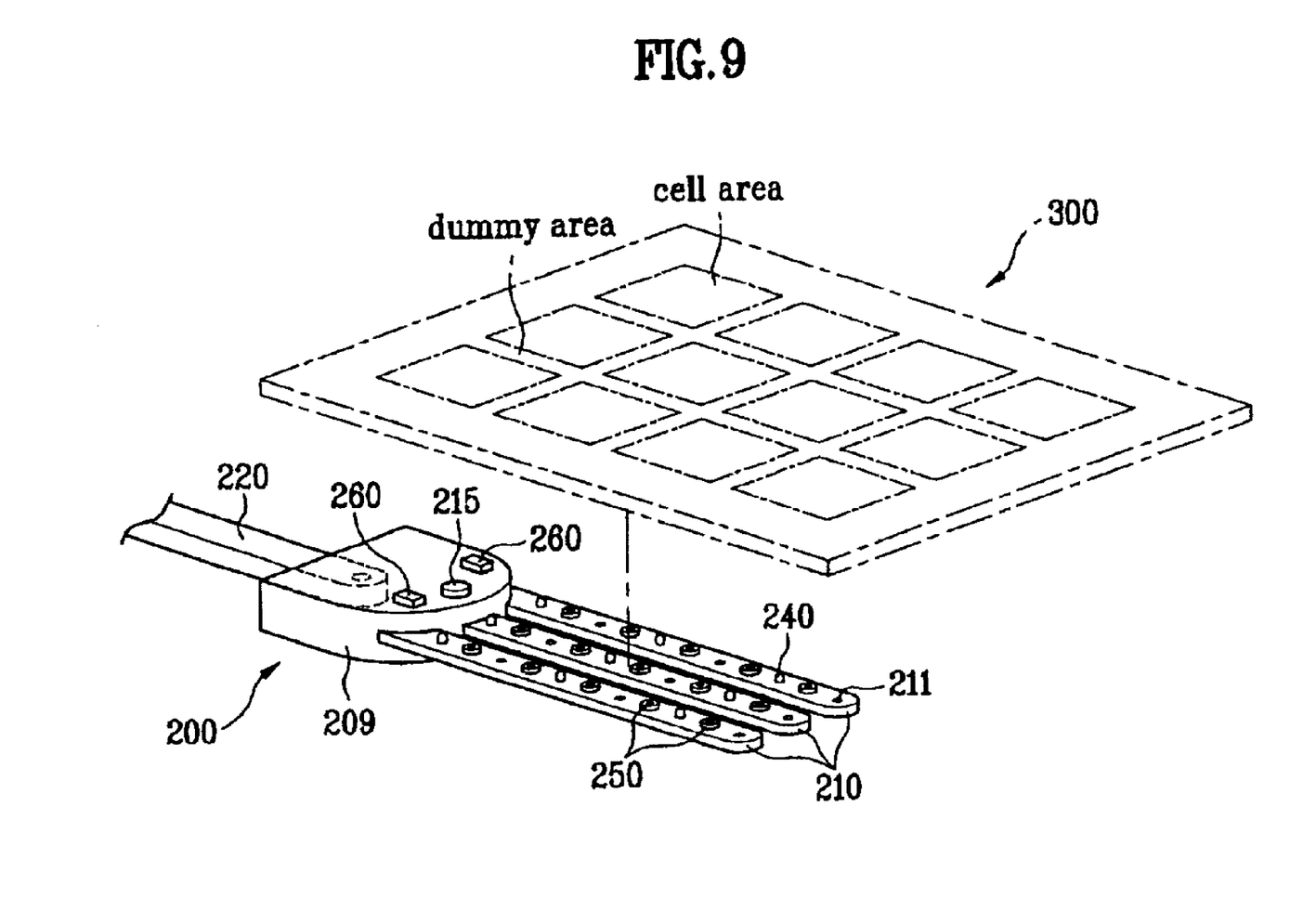
FIG. 9 is a perspective view of another exemplary substrate loading/unloading unit according to the present invention.

FIG. 9 is a perspective view of another exemplary substrate loading/unloading unit according to the present invention. In FIG. 9, the substrate loading/unloading unit may include a plurality of finger parts 210 each having a plurality of holes 211, a plurality of protrusions 240, a plurality of absorption parts 250, and an absorbing system 260 on a finger connector 209 for generating an absorbing force to the absorption parts 250. The absorption parts 250 and the protrusions 240 may be configured to extend to an equal height above an upper surface of the finger part 210. Alternatively, the absorption parts 250 may be configured to extend to a height less than a height of the protrusions 240. The absorbing system 260 may include a vacuum source to generate a vacuum force to the absorption parts 250, and the absorption parts 250 may have a pad-shaped configuration having vacuum holes in communication with the vacuum source. Alternatively, the absorption parts 250 may include an electrostatic chuck for generating an electrostatic force for electrostatically absorbing a substrate to the finger part 210, and the absorbing system 260 may include a power supply source for supplying power to the electrostatic chuck.

An operational process using the exemplary substrate loading/unloading units of the present invention will now be described with respect to FIGS. 4–9 using a substrate 300 having size of 1000 mm×1200 mm and having twelve cell areas. Each valve system 214 of the substrate loading/unloading unit 200 may be controlled to open the passage 213 communicated with the spaces 212 of the finger part 210. Accordingly, each of the spaces 212 may receive the force generated by the hydraulic or pneumatic source, and each of the protrusions 240 that correspond with the dummy areas of the substrate 300 extend above the upper surface of the finger part 210 to contact the dummy areas.

The location of each protrusion 240 to be extended may be determined by registering protrusion location information about the size and configuration of the substrate into a memory identification system (i.e., bar code) positioned on the substrate, accessing the identification system using a reader device (i.e., barcode reader) formed on the substrate during its loading, and enabling selected ones of the valve systems 214 to extend selected ones of the protrusions 240.

During the operational process, a controller may enable the hydraulic/pneumatic cylinder 215 to supply a force through each passage 213, thereby supplying the force into selected spaces 212 connected to the passage 213. Accordingly, the protrusion is extended along an upward direction by the force and the stopper 241 contacts the uppermost surface of the space 212. Thus, each upper portion of the protrusions 240 pass through the holes 211 and contact portions of the dummy areas of a bottom surface of the substrate 300 of the corresponding space. Likewise, the absorbing system 260 is enabled to supply an absorptive force to each of the absorption parts 250 that are controlled by a controller, and the absorptive force supplied to each of the absorption parts 250 absorbs the bottom surface of the substrate 300, thereby preventing movement of the substrate 300. Accordingly, the substrate 300 is securely affixed to the substrate loading/unloading unit 200, and the substrate 300 may be transferred to a processing station.

According to the present invention, when a bonded substrate is unloaded from the hardening unit, after the hardening process by the substrate loading/unloading unit 200, and is in a state that the protrusions 240 to be protruded are determined with respect to the selected size or substrate configuration, power is applied to the heating system 216 to elevate a temperature of the protrusions 240. For example, the temperature of the protrusions 240 may be about 50~150° C., and preferably may be about 80° C. to prevent heat flow from the bonded substrates to the protrusions 240. Accordingly, in order to maintain a precise predetermined temperature a controlling system and temperature sensors may be required. For example, contact thermocouples may be positioned on the finger parts 210 to provide feedback to a temperature controller for maintaining a precise temperature of the finger parts 210.

Alternatively, each of the protrusions 240 of the finger parts 210 may not necessarily protrude from the hole 211 by application of a force using a hydraulic or pneumatic source. For example, a mechanical system, such as a step motor (not shown), may be provided inside the spaces 212 in which the protrusions 240 are positioned, and may be axially coupled with the protrusion 240 to forcibly move the protrusion 240 by generating a mechanical force. Moreover, each protrusion 240 may be manually extended within each space by an operator.

Figure 10A:
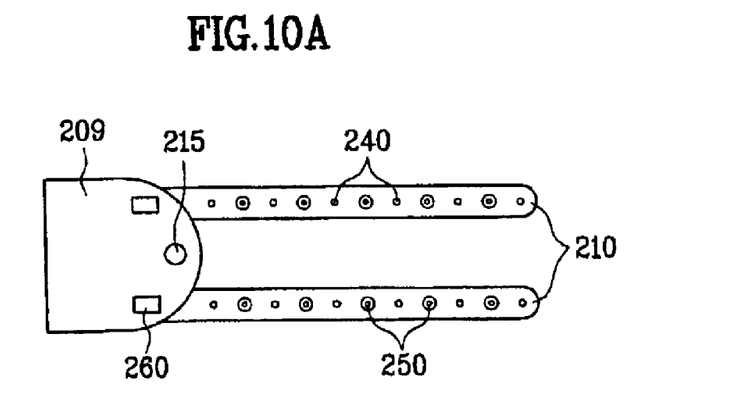
FIG. 10A is a plane view of another exemplary substrate loading/unloading unit for manufacturing a liquid crystal display device according to the present invention.

FIG. 10A is a plane view of another exemplary substrate loading/unloading unit for manufacturing a liquid crystal display device according to the present invention. In FIG. 10A, a substrate loading/unloading unit may include two finger parts 210, each having a plurality of protrusions 240, an absorption part 250, and absorbing systems 260 formed on a finger connector 209. The absorption part 250 may include a vacuum hole and the absorbing systems 260 may be include vacuum sources. Alternatively, absorption part 250 may include an electrostatic chuck and the absorbing systems 260 may include power supply sources. Moreover, the two finger parts 210 may each include a first finger part 210 having a plurality of protrusions 240, and a second finger part having absorption parts 250 and an absorbing system 260. Furthermore, each of the two finger parts 210 may include multiple combinations of both protrusions 240, absorption parts 250, and absorbing systems 260. Alternatively, the substrate loading/unloading unit may include three finger parts 210, each having multiple combinations of both protrusions 240, absorption parts 250, and absorbing systems 260.

Figure 10B:
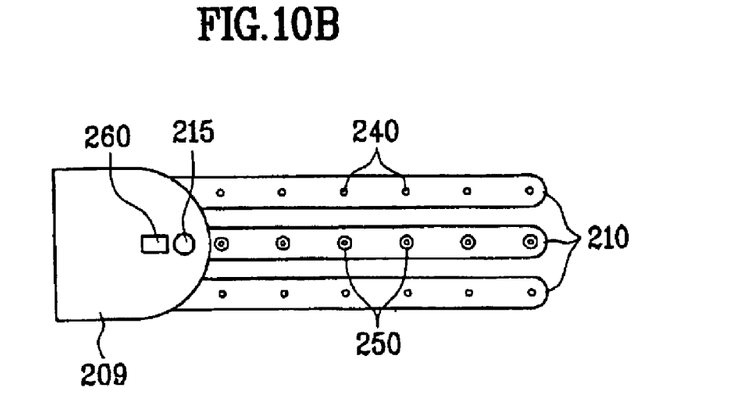
FIG. 10B is a plane view of another exemplary substrate loading/unloading unit for manufacturing a liquid crystal display device according to the present invention.

FIG. 10B is a plane view of another exemplary substrate loading/unloading unit for manufacturing a liquid crystal display device according to the present invention. In FIG. 10B, a substrate loading/unloading unit may include three finger parts 210. A first one of the finger parts 210 (i.e., a middlemost one) may have absorption parts 250 and an absorbing system 260 formed on a finger connector 209, and second and third ones of the finger parts 210 (i.e., outermost ones) may have a plurality of protrusions 240.

Figure 10C:
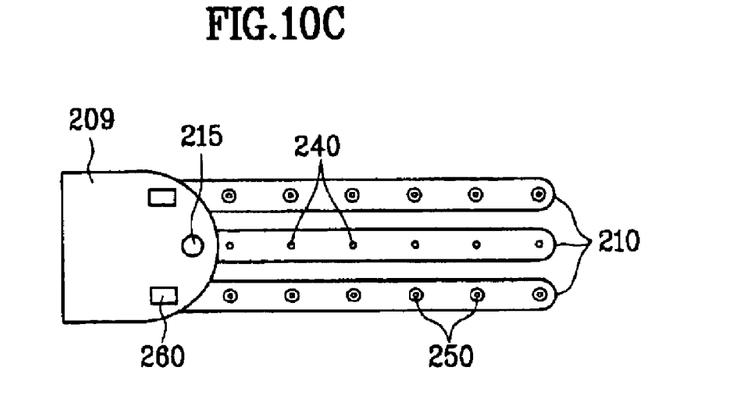
FIG. 10C is a plane view of another exemplary substrate loading/unloading unit for manufacturing a liquid crystal display device according to the present invention.

FIG. 10C is a plane view of another exemplary substrate loading/unloading unit for manufacturing a liquid crystal display device according to the present invention. In FIG. 10C, a substrate loading/unloading unit may include three finger parts 210. A first one of the finger parts 210 (i.e., middlemost one) may have a plurality of protrusions 240, and second and third ones of the finger parts 210 (i.e., outermost ones) may have absorption parts 250 and absorbing systems 260 formed on a finger connector 209. Accordingly, locations of the absorption parts 250 contact a majority of the substrate 300 along a circumference of the substrate 300, thereby minimizing damage to the cell regions.

It will be apparent to those skilled in the art that various modifications and variations can be made in the substrate loading/unloading apparatus of the present invention. Thus, it is intended that the present invention cover the modifications and variations of this invention provided they come within the scope of the appended claims and their equivalents.

What is claimed is:

1. A substrate loading/unloading apparatus, comprising:
   a body part;
   an arm part connected to the body part for loading/unloading a substrate;
   a finger connector connected to the arm part; and
   a plurality of finger parts connected to the finger connector,
   wherein each of the finger parts include a plurality of protrusions that extend above and retract below a surface portion of the finger part within a hole of the finger part to contact a bottom surface of the substrate, each of the protrusions having a stopper portion that engages an uppermost surface of the hole in an extended position and engages a lowermost surface of the hole in a retracted position.

2. The apparatus according to claim 1, wherein each of the finger parts include an absorption part for affixing the substrate using an absorptive force and the finger connector includes an absorbing system for generating the absorptive force.

3. The apparatus according to claim 1, wherein each of the finger parts include an electrostatic chuck for electrostatically affixing the substrate, and the finger connector includes a power supply source for supplying power to the electrostatic chuck.

4. The apparatus according to claim 1, wherein each of the protrusions move along a first direction perpendicular to a lengthwise direction of the finger parts.

5. The apparatus according to claim 4, wherein a plurality of spaces are formed inside each of the finger parts for receiving each of the protrusions and include a moving system for moving the protrusions along the first direction within the spaces.

6. The apparatus according to claim 1, wherein a plurality of spaces are formed inside each of the finger parts for receiving each of the protrusions, and each of the spaces is connected to a plurality of passages for delivering a force to the protrusion.

7. The apparatus according to claim 6, wherein a passage valve is provided for each of the passages for opening and closing the passage.

8. The apparatus according to claim 6, wherein the force is generated of one of a pneumatic pressure and a hydraulic pressure.

9. The apparatus according to claim 1, wherein each of the finger parts include a heating system for heating the protrusions that contact the bottom surface of the substrate.

10. The apparatus according to claim 9, wherein the heating system individually heats each of the protrusions.

11. The apparatus according to claim 10, wherein a plurality of spaces are formed inside each of the finger parts for receiving each of the protrusions and include a moving system for moving the protrusions along the first direction within the spaces.

12. The apparatus according to claim 1, wherein a height of each protrusion from the upper surface of each of the finger parts is less than about 20 mm.

13. A substrate loading/unloading apparatus, comprising:
    a body part;
    an arm part connected to the body part for loading/unloading a substrate;
    a finger connector connected to the arm part; and
    a plurality of finger parts connected to the finger connector,
    wherein each of the finger parts include at least one of a plurality of protrusions that extend above and retract below a surface portion of the finger part within a hole of the finger part and absorption parts for affixing the substrate by a transferred absorptive force, each of the protrusions having a stopper portion that engages an uppermost surface of the hole in an extended position and engages a lowermost surface of the hole in a retracted position.

14. The apparatus according to claim 13, wherein at least one of the finger parts includes both the protrusions and absorption parts.

15. The apparatus according to claim 14, wherein the finger connector includes an absorbing system for generating the absorptive force.

16. The apparatus according to claim 15, wherein the absorbing system includes a vacuum source, and the absorption parts include a plurality of vacuum holes.

17. The apparatus according to claim 15, wherein each of the finger parts include an electrostatic chuck and the finger connector includes a power supply source.

18. A substrate loading/unloading apparatus, comprising:
    a body part;
    an arm part connected to the body part for loading/unloading a substrate;
    a finger connector connected to the arm part; and
    a plurality of finger parts connected to the finger connector,
    wherein a first one of the finger parts includes a plurality of protrusions that extend above and retract below a surface portion of the finger part within a hole of the finger part, and second and third ones of the finger parts include an absorption part for affixing the substrate to the finger parts by an absorptive force, each of the protrusions having a stopper portion that engages an uppermost surface of the hole in an extended position and engages a lowermost surface of the hole in a retracted position.

19. The apparatus according to claim 18, wherein the absorptive force is generated by one of an electrostatic chuck and a vacuum source.

* * * * *